United States Patent [19]

Fujishita et al.

[11] Patent Number: 5,257,313
[45] Date of Patent: Oct. 26, 1993

[54] SURROUND AUDIO APPARATUS

[75] Inventors: Kaneaki Fujishita, Kanagawa; Kazuhiro Sato, Tokyo, both of Japan

[73] Assignee: Sony Corporation, New York, N.Y.

[21] Appl. No.: 725,454

[22] Filed: Jul. 3, 1991

[30] Foreign Application Priority Data

Jul. 9, 1990 [JP] Japan .................. 2-180892
Apr. 22, 1991 [JP] Japan .................. 3-118099

[51] Int. Cl.$^5$ ................................ H04S 5/02
[52] U.S. Cl. ........................... 381/18; 381/63
[58] Field of Search ...................... 381/18, 22, 63

[56] References Cited

U.S. PATENT DOCUMENTS

| | | | |
|---|---|---|---|
| 4,856,064 | 8/1989 | Iwamatsu . | |
| 4,920,569 | 4/1990 | Yoshio | 381/18 |
| 4,933,768 | 6/1990 | Ishikawa et al. | 381/18 |
| 4,998,281 | 3/1991 | Sakata | 381/63 |
| 5,027,687 | 7/1991 | Iwamatsu | 381/18 |
| 5,065,433 | 11/1991 | Ida et al. | 381/63 |

OTHER PUBLICATIONS

Audio Magazine, vol. 72, No. 11, Nov. 1988, pp. 82–92.
Fernseh-Und Kino-Technik, vol. 36, No. 2, Feb. 1982, pp. 62–68.
Communication dated Jul. 3, 1992.

Primary Examiner—Forester W. Isen
Attorney, Agent, or Firm—Lewis H. Eslinger; Jay H. Maioli

[57] ABSTRACT

A surround audio apparatus is comprised of an input terminal to which a stereo audio signal encoded for surround reproduction is supplied, an analog-to-digital converter for converting the stereo audio signal supplied to the input terminal into a digital audio signal, a digital signal processor for decoding the digital audio signal converted by the analog-to-digital converter in a surround stereo reproduction fashion to output a digital surround signal, a digital-to-analog converter for converting the digital surround signal from the digital signal processor into an analog surround signal, and an output terminal from which the analog surround signal from the digital-to-analog converter is delivered.

2 Claims, 5 Drawing Sheets

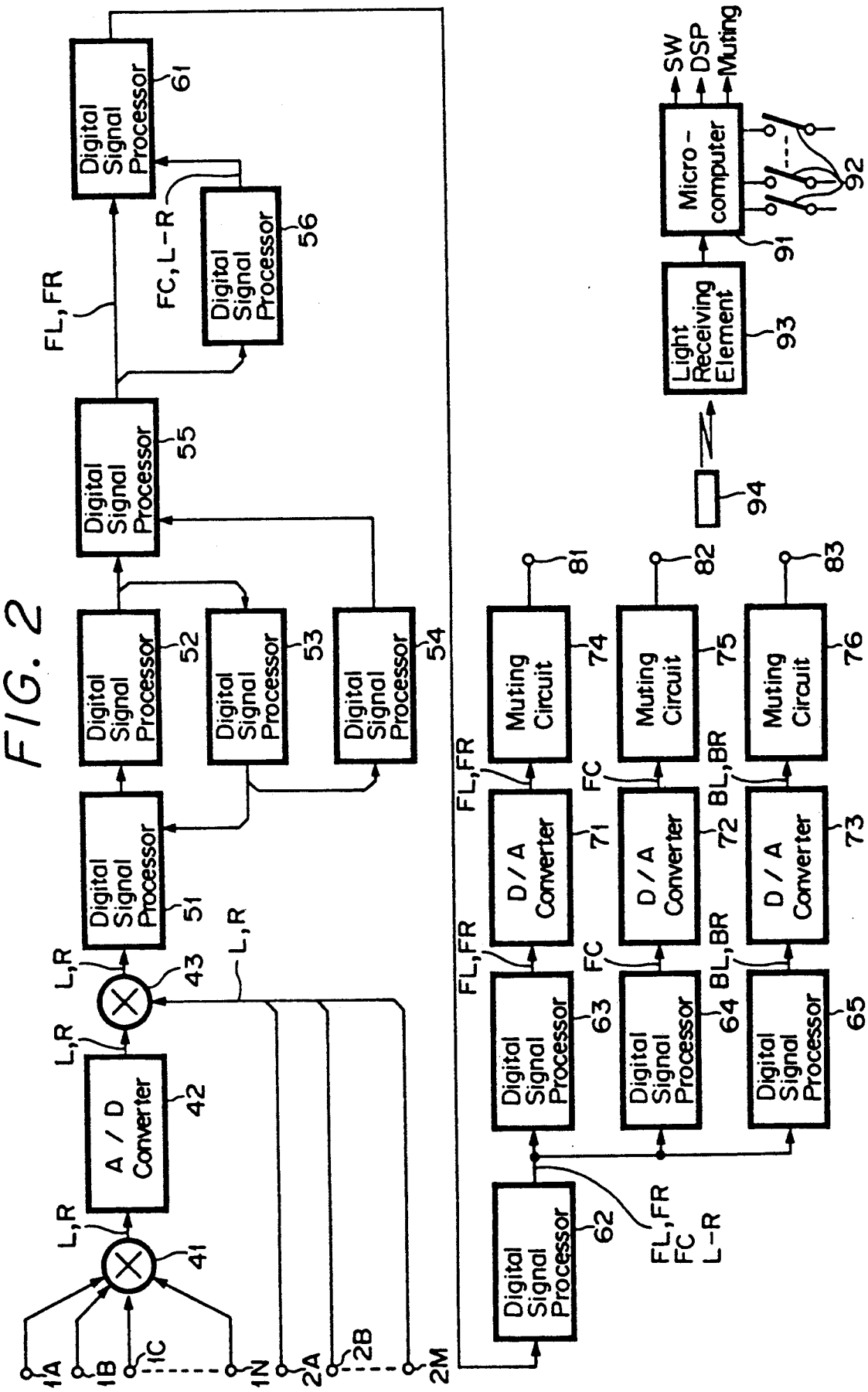

SURROUND AUDIO APPARATUS

BACKGROUND OF THE INVENTION

1. Field of the Invention

The present invention generally relates to audio apparatus and, more particularly, is directed to a surround audio apparatus.

2. Description of the Prior Art

A surround decoder of Dolby pro-logic (registered trademark) system has been known as a surround audio apparatus.

The surround decoder is hardware that can reproduce such a sound field as the software creator wants to produce with respect to sound of movies, etc. According to the surround decoder, an audio signal transmitted in the form of two channels is decoded to an audio signal of 4 channels while improving a crosstalk characteristic of the audio signal. Further, as an additional function, the surround decoder can create or correct the sound field so that listeners can listen to sound as if they were, for example, in a large concert hall.

An example of a conventional surround decoder will be described with reference to a schematic block diagram forming FIG. 1.

As shown in FIG. 1, there are provided a plurality of analog input terminals 1A to 1N, a plurality of digital input terminals 2A to 2M and input selector switches 13 to 15 which are operated in a ganged relation to each other. A digital-to-analog (D/A) converter 16 is interposed between the input selector switches 15 and 14.

Analog stereo audio signals L, R encoded for surround reproduction or ordinary analog stereo audio signals L, R are respectively supplied to the input terminals 1A to 1N and these stereo audio signals L, R are selected by the selector switches 13, 14.

Similar digital audio signals L, R are respectively supplied to the input terminals 2A to 2M and selected by the selector switch 15. The D/A converter 16 is adapted to convert the digital audio signals applied to the terminals 2A to 2M into analog audio signals because all signal processings such as the surround processing or the like are performed in an analog fashion.

Referring to FIG. 1, the signals L, R from the selector switch 14 are supplied through a balance adjusting circuit 21 and a switch 22 to a Dolby pro-logic decoder 23. The decoder 23 decodes the signals L, R on the basis of the levels and phases of the signals L, R supplied thereto to provide front left and right channel audio signals FL, FR and a front center channel audio signal FC. Also, the decoder 23 derives back left and right channel audio signals BL, BR in cooperation with a decoder 31 which will be described later.

The signals FL, FR are obtained by increasing the levels of the signals L, R in response to the level of the equi-phase component thereof and, the signal FC is mainly the equi-phase component of the signals L, R. Further, the signals BL, BR are mainly obtained from a difference component (L-R) of the signals L, R. The front left and right channel signals FL, FR from the decoder 23 are supplied through a switch 24 to an output terminal 25, and the center channel audio signal FC from the decoder 23 is supplied directly to an output terminal 26. Further, the decoder 23 derives the difference component (L-R) of the signals L, R and this difference component (L-R) is sequentially supplied to the decoder 31 and a delay circuit 32. The decoder 31 has a level expanding characteristic and a high band cutting characteristic, and the delay circuit 32 is adapted to reproduce a reverberation component in the concert hall or the like.

In this way, the delay circuit 32 derives the back left and right channel signals BL, BR and the signals BL, BR are supplied through a switch 33 to an output terminal 34.

As shown in FIG. 1, there is provided a test tone signal generator circuit 29. When the switch 22 is connected to the test tone signal generator 29 side, the test tone signal generator circuit 29 generates a test tone signal which is localized in the left front, right front, center front and rear at every second.

When the switch 24 is connected to the selector switch 14 side, the audio signals L, R selected by the selector switch 14 are directly supplied to the terminal 25.

The Dolby pro-logic system surround decoder is constructed as described above.

In the above surround decoder, however, the balance adjusting circuit 21, the Dolby pro-logic decoder 23, the test tone signal generator circuit 29, the decoder 31 and the delay circuit 32 are constructed by analog discrete parts and analog ICs so that the number of assembly parts is increased, which provides a large-sized and expensive surround audio apparatus.

Further, since the surround decoder is constructed by the analog discrete parts and analog ICs, the surround decoder must be adjusted in the assembly-process. Further, even though such adjustment is performed, aging change occurs frequently.

Furthermore, since the selector switches 13 and 14 are needed to switch the analog audio signals, there is then the disadvantage that the tone quality will be deteriorated by the contacts of the switches 13, 14.

OBJECTS AND SUMMARY OF THE INVENTION

Accordingly, it is an object of the present invention to provide an improved surround audio apparatus in which the aforementioned shortcomings and disadvantages encountered with the prior art can be eliminated.

More specifically, it is an object of the present invention to provide a surround audio apparatus in which assembly parts need not be adjusted in the assembly-process.

It is another object of the present invention to provide a surround audio apparatus which can produce optimum characteristics without adjustment.

It is still another object of the present invention to provide a surround audio apparatus in which an aging change can be avoided.

It is a further object of the present invention to provide a surround audio apparatus in which signal deterioration, such as decrease of S/N ratio and increase of signal distortion can be avoided so that excellent tone quality can be maintained.

It is a still further object of the present invention to provide a surround audio apparatus which can be made inexpensive.

It is a still further object of the present invention to provide a surround audio apparatus which can be made compact in size.

It is a yet further object of the present invention to provide a surround audio apparatus in which a sound field can be processed in a minute and variegated fashion.

As an aspect of the present invention, a surround audio apparatus comprises input terminals to which a plurality of digital audio signals encoded for surround reproduction are supplied, a first digital signal processor for generating a test tone signal, adjusting balance of level between the plurality of digital audio signals, a switching circuit for selectively supplying the plurality of digital audio signals to the first digital signal processor, a second digital signal processor for decoding an output signal of the first digital signal processor in a surround stereo reproduction fashion, a third digital signal processor for processing an output signal of the second digital signal processor so as to create or correct a sound field, a digital-to-analog converter for converting an output signal from the third digital signal processor into an analog audio signal, and an output terminal from which the analog audio signal from the digital-to-analog converter is delivered.

The generation of the test tone signal, the adjustment of balance of level between the plurality of digital audio signals and the correction of dynamic range are selectively performed by the first digital signal processor, the surround processing is performed by the second digital signal processor and the sound field is created or corrected by the third digital signal processor, thereby optimum audio reproduction which meets with listener's requirements and which is suitable for audio circumstances being realized.

The above and other objects, features, and advantages of the present invention will become apparent from the following detailed description of an illustrative embodiment thereof to be read in conjunction with the accompanying drawings, in which like reference numerals are used to identify the same or similar parts in the several views.

BRIEF DESCRIPTION OF THE DRAWINGS

FIG. 2 is a schematic block diagram showing an embodiment of a surround audio apparatus according to the present invention;

DESCRIPTION OF THE PREFERRED EMBODIMENT

Figure 1:
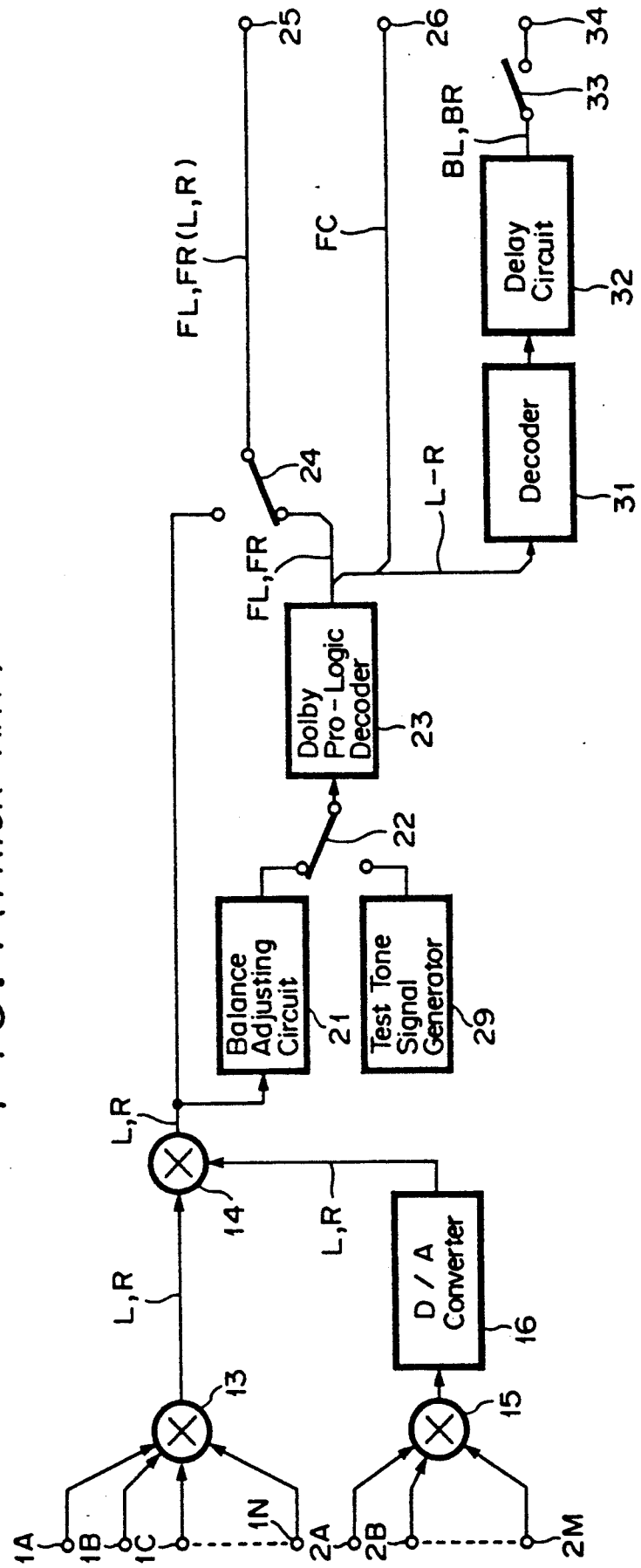
FIG. 1 is a schematic block diagram showing an example of a conventional surround decoder.

Referring to the drawings in detail and, initially to FIG. 2, an embodiment of the surround audio apparatus according to the present invention will be described hereinafter.

Referring to FIG. 2, a microcomputer 91 is provided to control the entirety of this surround audio apparatus. The microcomputer 91 is connected with various operation keys 92 and derives a control signal, a program or data associated with the key outputs. The control signal, program or data are supplied to switching circuits 41, 43, digital signal processors (DSPs) 51 to 65 and muting circuits 74 to 76 which will be described later. In this embodiment, the microcomputer 91 might be a microcomputer $\mu$PD-78224 manufactured by NEC CORPORATION.

A transmitter 94 is of a remote controller type and this transmitter 94 emits a remote control signal associated with its key operation. If the remote control transmitter 94 is of, for example, the infrared type remote controller, the remote control transmitter 94 emits an infrared light as the control signal. This infrared light is received by a light receiving element 93, from which the remote control signal is supplied to the microcomputer 91.

Accordingly, when the key on the remote control transmitter 94 is operated, the processing similar to that of the key 92 is performed.

Analog stereo audio signals L, R encoded for the surround reproduction or standard analog stereo audio signals L, R are respectively supplied to the analog input terminals 1A to 1N. These stereo audio signals L, R are supplied to a switching circuit 41 and the switching circuit 41 is controlled by the control signal from the microcomputer 91 so as to select a pair of signals L, R from the audio signals applied to the input terminals 1A to 1N. Then, the selected signals L, R are supplied to an analog-to-digital (A/D) converter 42, in which they are converted into digital audio signals L, R and then fed to a switching circuit 43.

Further, similar digital audio signals L, R are supplied to digital input terminals 2A to 2M and these signals are supplied to a switching circuit 43.

Then, the switching circuit 43 is controlled by the control signal from the microcomputer 91 so as to select a pair of signals L, R from the audio signals (digital audio signals) applied to the terminals 1A to 1N and 2A to 2M, and the selected signals L, R are supplied to digital signal processors 51 to 65, sequentially.

Each of the digital signal processors 51 to 65 is formed of a microcomputer for processing a digital audio signal and is formed as a one-chip IC. The digital signal processors 51 to 65 store program or data supplied from the microcomputer 91 and process each of the digital audio signals passing therethrough in a predetermined manner in accordance with the program or data. In this embodiment, each of the digital signal processors 51, 52, 53, 54, 55, 56, 61 and 62 might be formed of a microcomputer IC, CXD-1160 manufactured by SONY CORPORATION and each of the digital signal processors 63, 64 and 65 might be formed of a microcomputer IC, CXD-1355 manufactured by SONY CORPORATION.

More specifically, when the user, for example, operates the key 92, processing program or data is loaded on the digital signal processor associated with the key operation in the digital signal processors 51 to 65 from the microcomputer 91 and in the next period, the corresponding digital signal processor processes the digital audio signal in accordance with the loaded program or data.

The digital signal processor 51 mainly serves as the balance adjusting circuit 21, the test tone signal generator circuit 29 and the switch 22 in FIG. 1 to perform the following processing:

(1) to generate the test tone signal;
(2) to automatically adjust balance of levels between sources;
(3) to adjust balance of levels between sources in a manual fashion; and
(4) to correct the dynamic range (expand or compress the signal).

The items (1) to (4), i.e., the generation of test tone signal, the adjustment of balance and the correction of dynamic range are selectively performed and switched when the program or data loaded to the digital signal processor 51 is varied in response to the operation of the key 92.

Further, the digital signal processors 52 to 56 serve as the Dolby pro-logic decoder 23 in FIG. 1 to perform the surround processing, whereby the digital signal processor 55 derives the front signals FL, FR and the digital signal processor 56 derives the center front signal FC and the difference component (L-R). The surround processing of the digital signal processors 52 to 56 can be further turned on and off by operating the key 92. Further, when the digital signal processor 51 automatically adjusts the balance of levels between the sources as in the item (2), a predetermined signal is fed from the digital signal processor 52 back to the digital signal processor 51, in which it is used to automatically adjust the balance of levels.

Furthermore, the digital signal processors 61 to 65 are mainly used to create or correct the sound field. That is, the digital signal processors 61, 62 perform parametric equalizer processing (i.e., equalizer processing for changing a central level and a central frequency by a bandpass characteristic or band-eliminating characteristic), and the digital signal processors 63 to 65 add reverberation to reproduce sound characteristics of the concert hall or the like.

The digital signal processor 63 derives the front channel signals FL, FR and the digital signal processor 64 derives the center channel signal FC. Further, the digital signal processor 65 serves also as the decoder 31, the delay circuit 32 and the switch 33 in FIG. 1 and produces the back channel signals BL, BR by performing the level expansion, the high band cutting and addition of reverberation upon the difference component (L-R).

The processed amount in the digital signal processors 61 to 65 can be varied, for example, in thirty ways by operating the key 92.

The signals FL, FR from the digital signal processor 63 are supplied to a D/A converter 71, in which they are converted into analog signals FL, FR. These signals FL, FR are supplied through a muting circuit 74 to a terminal 81 and, the signal FC from the digital signal processor 64 is supplied to a D/A converter 72, thereby being converted into an analog signal FC. This analog signal FC is supplied through a muting circuit 75 to a terminal 82. The signals BL, BR from the digital signal processor 65 are supplied to a D/A converter 73, in which they are converted into analog signals BL, BR. These signals BL, BR are supplied through a muting circuit 76 to a terminal 83.

According to the above-mentioned circuit arrangement, a predetermined program or data is loaded on the digital signal processors 51 to 65 from the microcomputer 91 in accordance with the operation of the key 92 and that program is executed by the digital signal processors 51 to 65, thereby the following operations modes being realized.

A. Mode for Creating or Correcting Surround Effect and Sound Field (A-1)

In this case, the digital signal processors 52 to 56 perform the Dolby pro-logic processing and the digital signal processors 61 to 65 perform creation and correction of the sound field, thereby the signals FL, FR, FC, BL, BR being produced.

Figure 3A:
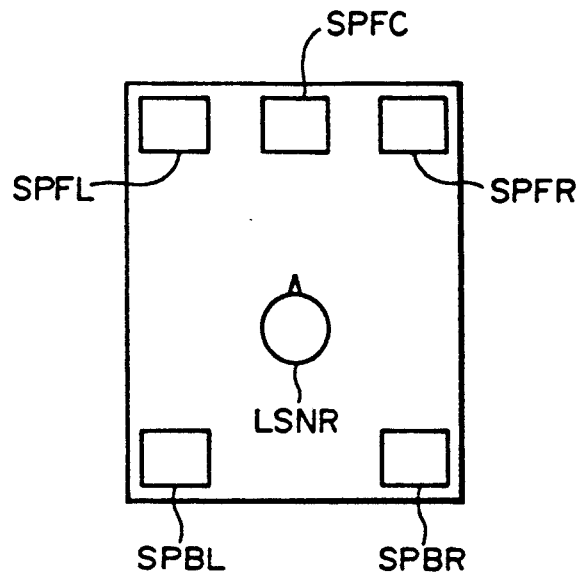
FIGS. 3A and 3B are respectively plan views used to explain the sound field.

Accordingly, as shown in FIG. 3A, sounds of the signals FL, FR, FC, BL, BR are produced from speakers SPFL, SPFR disposed in the left and right front of a listener LSNR, from a speaker SPFC disposed in the center forward of the listener LSNR and from speakers SPBL, SPBR disposed in the left and right rear sides of the listener LSNR, thereby reproducing the sound in a surround mode. Also, the sound field is associated with the processed amount of the digital signal processors 61 to 65.

For example, when a piece of music is played back, the surround effect achieved by the digital signal processors 52 to 56 brings about presence so that the listener feels as if he was in the audience in the concert hall. Also, the sound field processing by the digital signal processors 61 to 65 can bring about other presence so that the listener feels as if he was in the audience in the large concert hall.

B. Mode for Creating or Correcting Surround Effect and Sound Field (A-2)

Also in this case, the similar processing to that of A-1 is performed but the signal FC is not produced. The signal FC is mixed into the signals FL, FR with a predetermined ratio by the digital signal processor 63 and the signal line of the signal FC is made off (placed in the muting condition) by the digital signal processor 64.

Figure 3B:
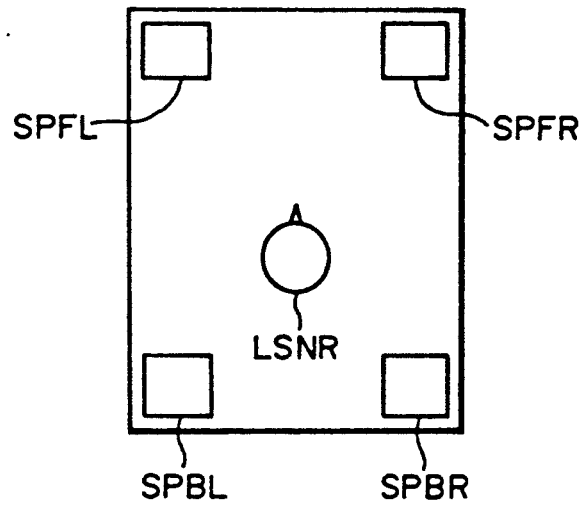

Accordingly, the surround reproduction and the creation or correction of the sound field similar to those of A-1 are executed by the speakers SPFL, SPFR, SPBL, SPBR disposed as shown in FIG. 3B.

C. Mode for Achieving Only Surround Effect

In this case, the signal processings in the digital signal processors 61 to 65 are not performed. That is, although the front channel signals FL, FR from the digital signal processor 55 pass supplied through the digital signal processors 61, 62 and 63 in that order, no sound field processing is carried out at all but these front channel signals FL, FR are supplied to the D/A converter 71 and the thus converted analog signals FL, FR are developed at the terminal 81.

Further, although the difference component (L-R) from the digital signal processor 56 passes through the digital signal processors 61, 62 and 65, no sound field processing is carried out at all but the difference component (L-R) is supplied to the D/A converter 73 and the difference component (L-R) is fed to the terminal 83 as the back channel signals BL, BR. In this case, the digital signal processor 64 turns off its signal line.

Accordingly, in this case, the audio signal is reproduced in the the surround mode by the speakers SPFL, SPFR, SPBL, SPBR disposed as shown in FIG. 3B.

D. Mode in Which Sound Field is Only Created or Corrected

In this case, the signal processing is not performed in the digital signal processors 52 to 56. That is, the signals L, R from the digital signal processor 51 are not processed in a surround-fashion by the digital signal processors 52 and 53 and are supplied to the digital signal processor 61.

Thereafter, the signals L, R are processed by the digital signal processors 61 to 65 so as to create or correct the sound field, whereby the output signals of the D/A converters 71, 72 are supplied to the terminals 81, 82 as the front channel signals FL, FR, FC and the output signal from the D/A converter 73 is supplied to the terminal 83 as the back channel signals BL, BR.

In this mode D, similarly to the modes A-1 and A-2, by varying the processed amount in the digital signal processors 61 to 65 by operating the key 92, the signals L, R can be output as the signals FL, FR, FC or BL, BR without being processed at all or the signals L, R can be processed by the maximum processing amount and then output.

Therefore, in this mode D, it is possible to realize various sound fields from a non-corrected ordinary two channel stereo sound field to a newly-created sound field.

E. Mode in Which Surround Effect and Sound Field Processing are not Performed In this mode E, signal processing is not performed at all so that, although the signals L, R from the digital signal processor 51 pass through the digital signal processors 52 to 63, they are not processed at all but are fed to the terminal 81 as they are. That is, this mode E becomes the ordinary two channel stereo reproduction mode.

Figure 4A:
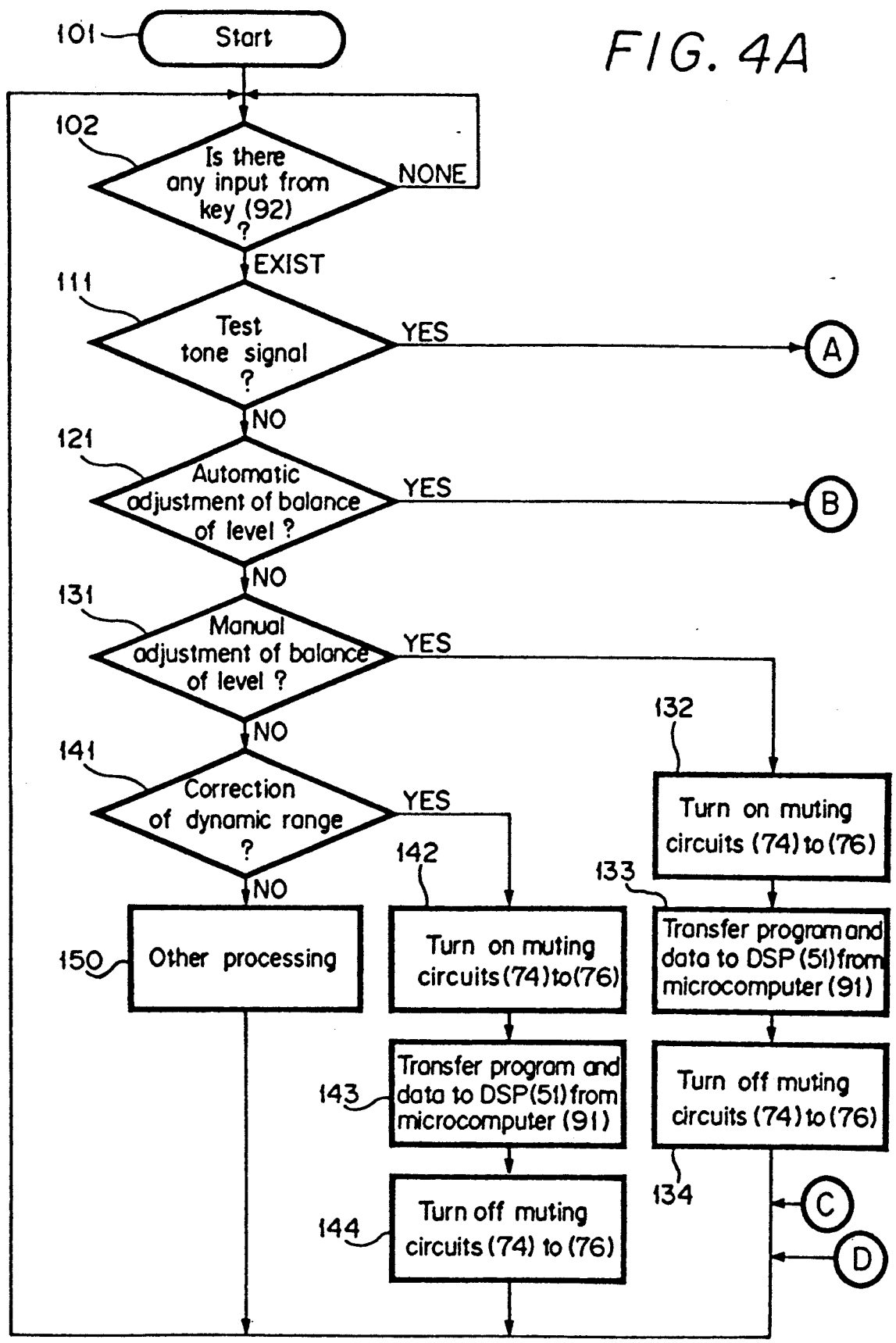
FIG. 4 (formed of FIGS. 4A and 4B) is a flowchart to which references will be made in explaining operation of the surround audio apparatus of the present invention.
Figure 4B:
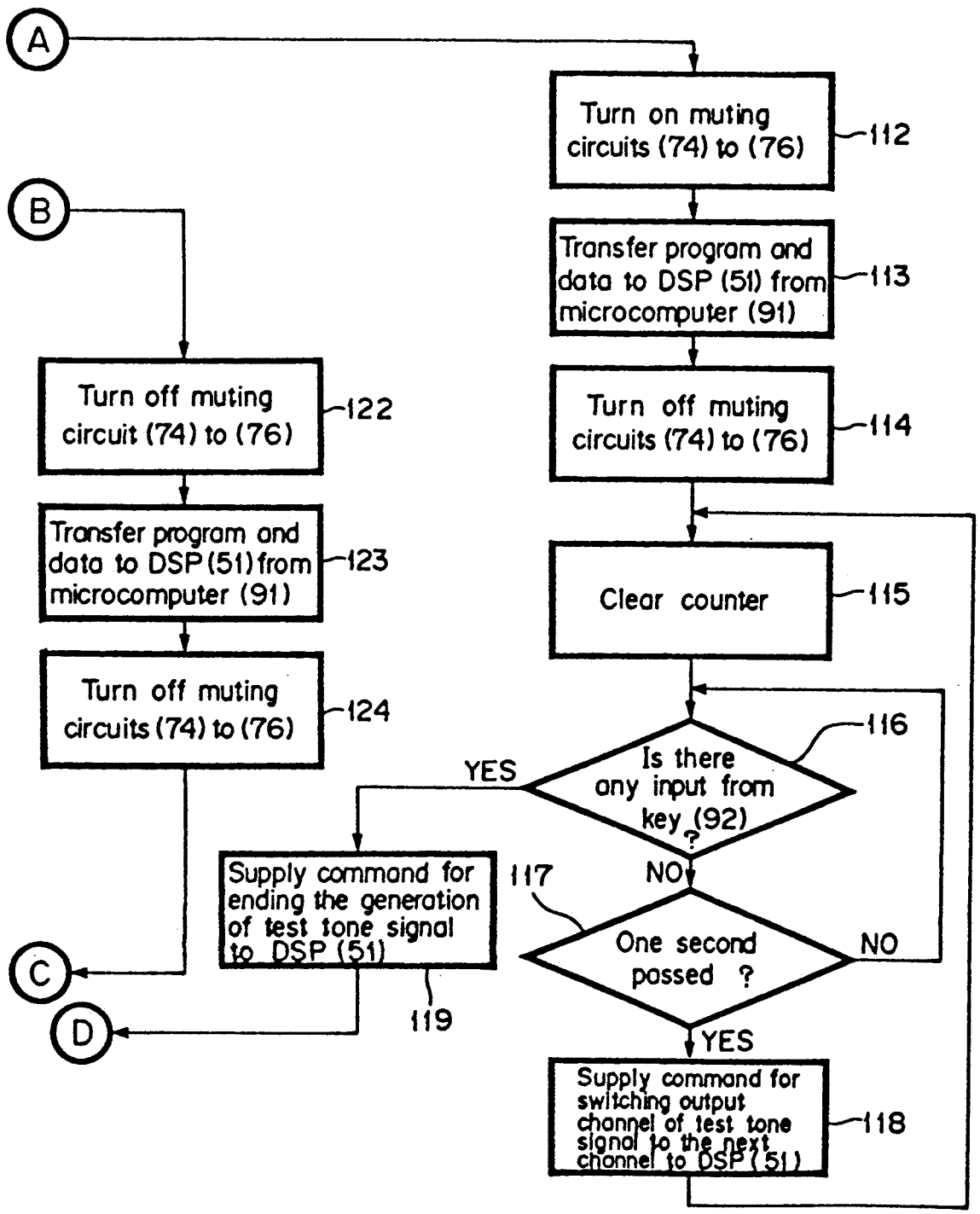

FIG. 4 is a flowchart of a processing routine done by the microcomputer 91 so that the processings on the items (1) to (4) are selectively executed by the digital signal processor 51. FIG. 4 is formed of FIGS. 4A and 4B drawn on two sheets of drawings so as to permit the use of a suitably large scale.

Referring to FIG. 4, the processing of the microcomputer 91 begins with step 101 and the processing proceeds to the next decision step 102. It is determined in decision step 92 whether or not there is an input from the key 92. If there is no input from the key 92, then the processing of step 102 is repeated.

If an input is presented by the key 92 when step 102 is repeated, then this input is determined in step 102 and the processing proceeds from step 102 to the next decision step 111. It is determined in decision step 111 whether or not the key input is to generate the test tone signal as in the item (1). If a NO is output at decision step 111, then the processing proceeds from step 111 to the next decision step 121.

It is determined in decision step 121 whether or not the key input in step 102 is to automatically adjust balance of levels between the sources as in the item (2). If a NO is output at decision step 121, then the processing proceeds from step 121 to the next decision step 131, whereat it is determined whether or not the key input in step 102 is to manually adjust balance of levels between the sources as in the item (3). If a NO is output at decision step 131, then the processing proceeds from step 131 to the next decision step 141.

It is determined in decision step 141 whether or not the key input in step 102 is to correct the dynamic range as in the item (4). If a NO is output at decision step 141, then the processing proceeds from step 141 to step 150. In this step 150, the processing associated with the key input in step 102 (i.e., other processing than those of the items (1) to (4)) is executed. Then, the processing of the microcomputer 91 returns to step 102, whereat it is determined again whether or not an input is inputted by the key 92.

If it is determined in decision step 111 that the key input in step 102 is to generate the test tone signal as in the item (1), then the processing proceeds from step 111 to step 112. In step 112, the muting circuits 74 to 76 are turned on. In the next step 113, program and data for generating the test tone signal are transferred from the microcomputer 91 to the digital signal processor 51. Then, the muting circuits 74 to 76 are turned off in step 114.

If the program and data for generating the test tone signal is transferred from the microcomputer 91 to the digital signal processor 51 in step 113, the digital signal processor 51 executes such program to generate the test tone signal which is output as, for example, the front left channel signal LF.

Accordingly, the digital audio signals L, R from the switching circuit 43 are muted by the digital signal processor 51 and the test tone signal is generated by the digital signal processor 51. Then, this test tone signal is supplied to the terminals 81 to 83 so that a test tone is propagated, for example, from the left front speaker SPLF.

In the next step 115, the counter is cleared to be 0 and then the processing proceeds to the next decision step 116. It is determined in decision step 116 whether or not there is an input from the key 92. If there is no input from the key 92, then the processing proceeds from step 116 to the next decision step 117. In step 117, it is determined whether or not one second has passed in the counter of step 115.

If one second has not passed as represented by a NO at decision step 117, then the processing returns from step 117 to step 116. Then, steps 116 and 117 are repeated until an input is inputted by the key 92 or until one second has passed.

If one second has passed as represented by a YES at decision step 117, then the processing proceeds from step 117 to step 118. In step 118, a command for switching the output channel of the test tone signal to the next channel is supplied to the digital signal processor 51 and then, the processing returns to step 115.

Accordingly, if there is no input from the key 92, then steps 115 to 118 are repeated and the output channel of the test tone signal is switched to the left front channel, the center channel, the right front channel and the back channel at every second, in that order, whereby the test tone is sequentially emanated from each channel speaker at every second.

If there appears an input from the key 92 during the time steps 115 to 118 are repeated, then this key input is determined in decision step 116 and the processing proceeds from step 116 to step 119. In step 119, a command for ending the generation of the test tone signal is supplied to the digital signal processor 51 and then the processing returns to decision step 102.

Accordingly, the digital signal processor 51 finishes generating the test tone signal and is returned to the mode in which the digital signal from the switching circuit 43 is supplied to the digital signal processor 52 from the digital signal processor 51. Therefore, if the key 92 is operated during the time steps 115 to 118 are repeated to sequentially produce the test tone from the respective channel speakers, then the test tone is not propagated any more and the surround audio apparatus is returned to the ordinary operation mode.

If it is determined in decision step 121 that the key input in step 102 is to automatically adjust balance of levels between the sources as in the item (2), then the processing proceeds from step 121 to step 122. In step 122, the muting circuits 74 to 76 are turned on and in the next step 123, the program and data for automatically adjusting the balance of levels between the sources are transferred to the digital signal processor 51 from the microcomputer 91. In the next step 124, the muting circuits 74 to 76 are turned off and then the processing returns to step 102.

At that time, if the program and data for automatically adjusting the balance of levels between the sources are transferred from the microcomputer 91 to the digital signal processor 51 in step 123, then such program is executed by the digital signal processor 51. Therefore, the balance of levels between the sources is adjusted automatically and the adjusted result is set to the digital signal processor 51 so that the level can be prevented from fluctuating even when the source is switched.

Further, if it is determined in decision step 131 that the key input in step 102 is to manually adjust the balance of levels between the sources as in the item (3), then the processing proceeds from step 131 to step 132, whereat the muting circuits 74 to 76 are turned on. In the next step 133, the program and data for manually adjusting the balance of levels between the sources is transferred to the digital signal processor 51 from the microcomputer 91. In the next step 134, the muting circuits 74 to 76 are turned off and then the processing returns to step 102.

Therefore, by operating the key 92, the input level for each source is set in the digital signal processor 51 and the set result is set to the digital signal processor 51 so that, when the source is switched, the level becomes coincident with the thus set level.

Furthermore, if it is determined in decision step 141 that the key input in step 102 is to correct the dynamic range as in the item (4), then the processing proceeds from step 141 to step 142, whereat the muting circuits 74 to 76 are turned on. In the next step 143, the program and data for correcting the dynamic range are transferred to the digital signal processor 51 from the microcomputer 91. In the next step 144, the muting circuits 74 to 76 are turned off and then the processing returns to step 102.

Therefore, by operating the key 92, the input and output characteristic is set to the dynamic range correcting characteristic by the digital signal processor 51 and the corrected result is set in the digital signal processor 51 so that the digital signal processor 51 may have the thus set input and output characteristic.

As described above, according to the present invention, since all surround processings are realized in a digital processing fashion, the assembly parts need not be adjusted in the assembly-process and best characteristics can be obtained without adjustment. Further, the aging change can be avoided.

Since the digital signal processors 51 to 65 can be each formed by one-chip IC and a general-purpose digital signal processor can be utilized as these digital signal processors 51 to 65, the surround audio apparatus becomes inexpensive and can be prevented from being increased in size. Alternatively, the digital signal processors 52 to 56 can be formed by a one-chip IC for exclusive-use.

Since other processings than the selection of the signal in the switching circuit 41 are performed in a digital processing fashion, the signal can be prevented from being deteriorated, for example, a signal-to-noise (S/N) ratio can be prevented from being lowered and the signal distortion can be prevented from being increased, thereby excellent tone quality being maintained.

Further, since various programs and data are selectively supplied to the digital signal processor 51 so that the generation of the test tone signal, the automatic level balance adjustment between the sources, the manual level balance adjustment between the sources and the correction of the dynamic range can be selectively performed, the digital signal processor 51 can be made very useful from an efficiency standpoint and the number of assembly parts can be reduced accordingly, which can provide a relatively inexpensive surround audio apparatus.

Furthermore, since the sound field is created or corrected by the digital signal processors 61 to 65, the predetermined signal processing can be performed by varying only the program or data, thus making it possible to process the sound field in a minute and variegated fashion.

Still further, since the signals FL, FR, FC, (L-R) are supplied in series with the digital signal processors 61, 62 which perform equalizer processing and to the digital signal processors 63 to 65 which perform reverberation processing when the sound field is created or corrected, the hardware of this surround audio apparatus can be simplified and the equalizer processing and the reverberation processing can be performed in the digital signal processors 61 to 65 independently and properly.

Yet further, since the switching on and off of the surround processing in the digital signal processors 52 to 56 and the adjustment of the sound field processing in the digital signal processors 61 to 65 can be independently performed, the surround audio apparatus can cope various sources and meet with various requirements.

While the digital signal processors 51 to 65 are each formed of a relatively inexpensive microcomputer IC and a number of independent ICs are employed in consideration of processing capability as described above, microcomputers of large processing capability also can be utilized. For example, if the digital signal processors 51 to 55 are formed as one chip IC and the digital signal processors 56, 61 and 62 are formed as one chip IC, then the number of assembly parts can be reduced considerably.

Having described the preferred embodiment of the invention with reference to the accompanying drawings, it is to be understood that the invention is not limited to that precise embodiment and that various changes and modifications thereof could be effected by one skilled in the art without departing from the spirit or scope of the novel concepts of the invention as defined in the appended claims.

What is claimed is:

1. A surround audio apparatus comprising:
   input terminals to which a plurality of digital audio signals encoded for surround reproduction are supplied;
   a first digital signal processor for generating a test tone signal and for adjusting level balances between selected ones of said plurality of digital audio signals;
   a switching circuit connected to said input terminals and said first digital signal processor for supplying selected ones of said plurality of digital audio signals to said first digital signal processor;
   a second digital signal processor connected to said first digital signal processor for decoding an output signal of said first digital signal processor in a surround stereo reproduction fashion and producing a feedback signal fed to said first digital signal processor for adjusting said level balances between selected ones of said plurality of digital signals;
   a third digital signal processor connected to said second digital signal processor for processing an output signal of said second digital signal processor so as to create or correct a sound field;

digital-to-analog converter means connected to said third digital signal processor for converting an output signal from said third digital signal processor into an analog audio signal; and an output terminal connected to said digital-to-analog converter from which said analog audio signal is delivered.

2. A surround audio apparatus comprising:

input terminals to which a plurality of digital audio signals encoded for surround reproduction are supplied;

first digital signal processor for generating a test tone signal, adjusting balance of levels between selected ones of said plurality of digital audio signals and correcting a dynamic range;

a switching circuit connected to said input terminals and said first digital signal processor for selectively supplying two of said plurality of digital audio signals to said first digital signal processor;

second digital signal processor means including a plurality of digital signal processors connected to said first digital signal processor means for decoding output signals from said first digital signal processor in a surround stereo reproduction fashion and producing a feedback signal fed to said first digital signal processor means for said adjusting balance of levels thereby;

third digital signal processor means connected to said second digital signal processor means for performing parametric equalization processing;

fourth digital signal processor means including a plurality of parallel connected digital signal processors each connected to said third digital signal processor means for performing a reverberation processing;

a digital-to-analog converter connected to said fourth digital signal processor means; and a pair of output terminals from which analog signals from said digital-to-analog converter are respectively delivered, wherein output signals of said second digital signal processor means are supplied in series to said third and fourth digital signal processor means, thereby being converted to equalizer-processed and reverberation-processed digital signals and said digital signals are supplied to said digital-to-analog converter.

* * * * *